United States Patent [19]

Olsson

[11] 4,172,626
[45] Oct. 30, 1979

[54] CONNECTOR CLIP FOR CONNECTING CABLE CONDUCTORS TO CIRCUIT BOARD CONDUCTORS

[75] Inventor: Billy E. Olsson, New Cumberland, Pa.

[73] Assignee: AMP Incorporated, Harrisburg, Pa.

[21] Appl. No.: 918,139

[22] Filed: Jun. 22, 1978

[51] Int. Cl.² ............................................. H05K 1/12
[52] U.S. Cl. .......................... 339/17 F; 339/176 MF
[58] Field of Search ..................... 339/17 F, 176 MF

[56] References Cited

U.S. PATENT DOCUMENTS 3,629,787  12/1971  Wilson ............................... 339/17 F

FOREIGN PATENT DOCUMENTS 2241888  3/1975  France .............................. 339/176 MF Primary Examiner—Neil Abrams
Attorney, Agent, or Firm—Frederick W. Raring

[57] ABSTRACT

Connector clip for connecting conductors in a flat cable to conductors on a circuit board comprises a clip bar having parallel side edges, reversely formed cantilever springs extending from one end of the edges, and flanges extending from the ends of the clip bar. The connector clip is mounted on the circuit board with the ends of the springs resiliently biased against the circuit board conductors. The cable is inserted between the ends of the springs and the surfaces of the circuit board conductors to connect the cable conductors to the circuit board conductors. The circuit board conductors may be either terminal posts or flat conductors on the surface of the board. Strain relief means are provided for positive locking of the cable.

10 Claims, 13 Drawing Figures

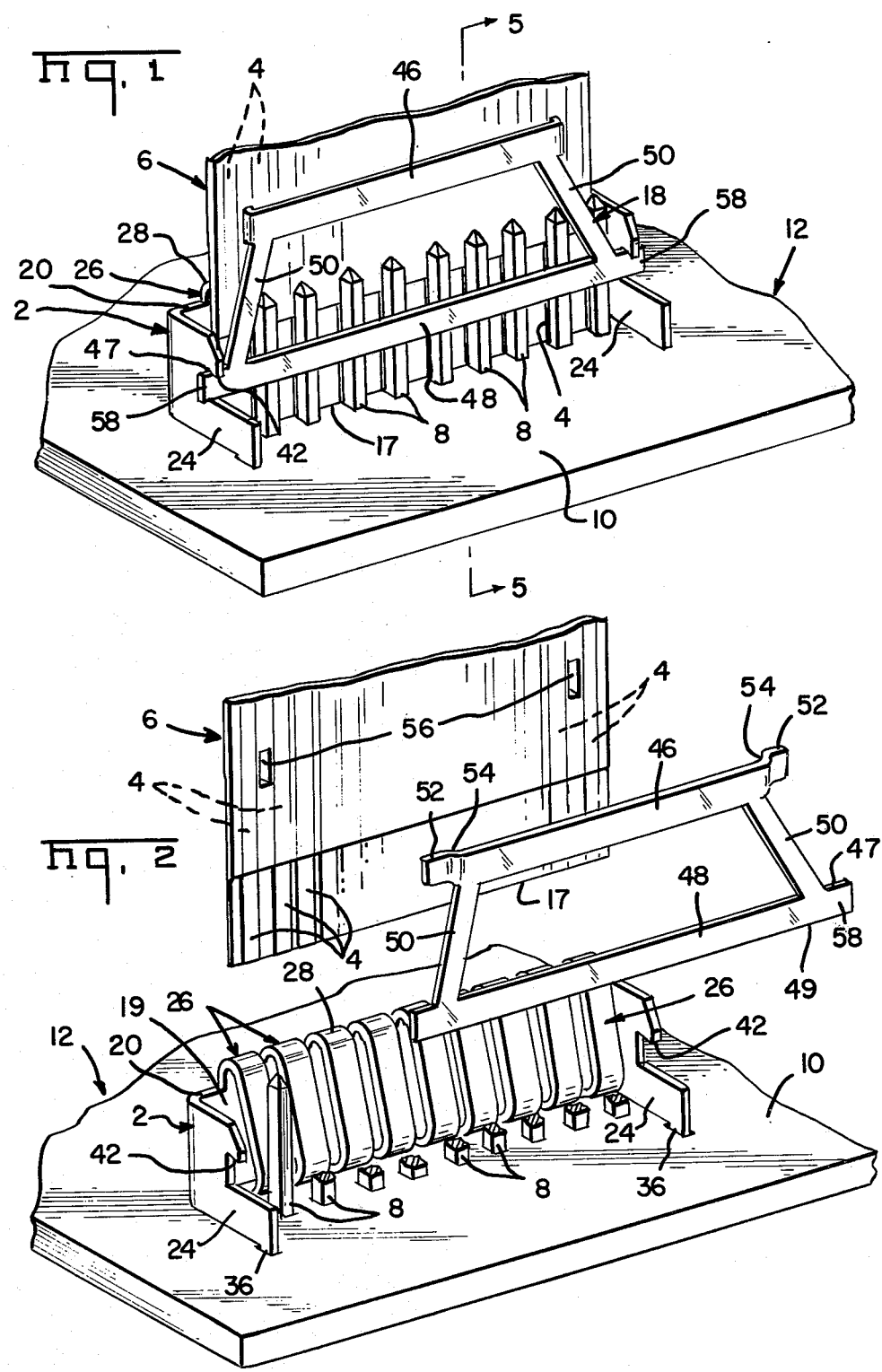

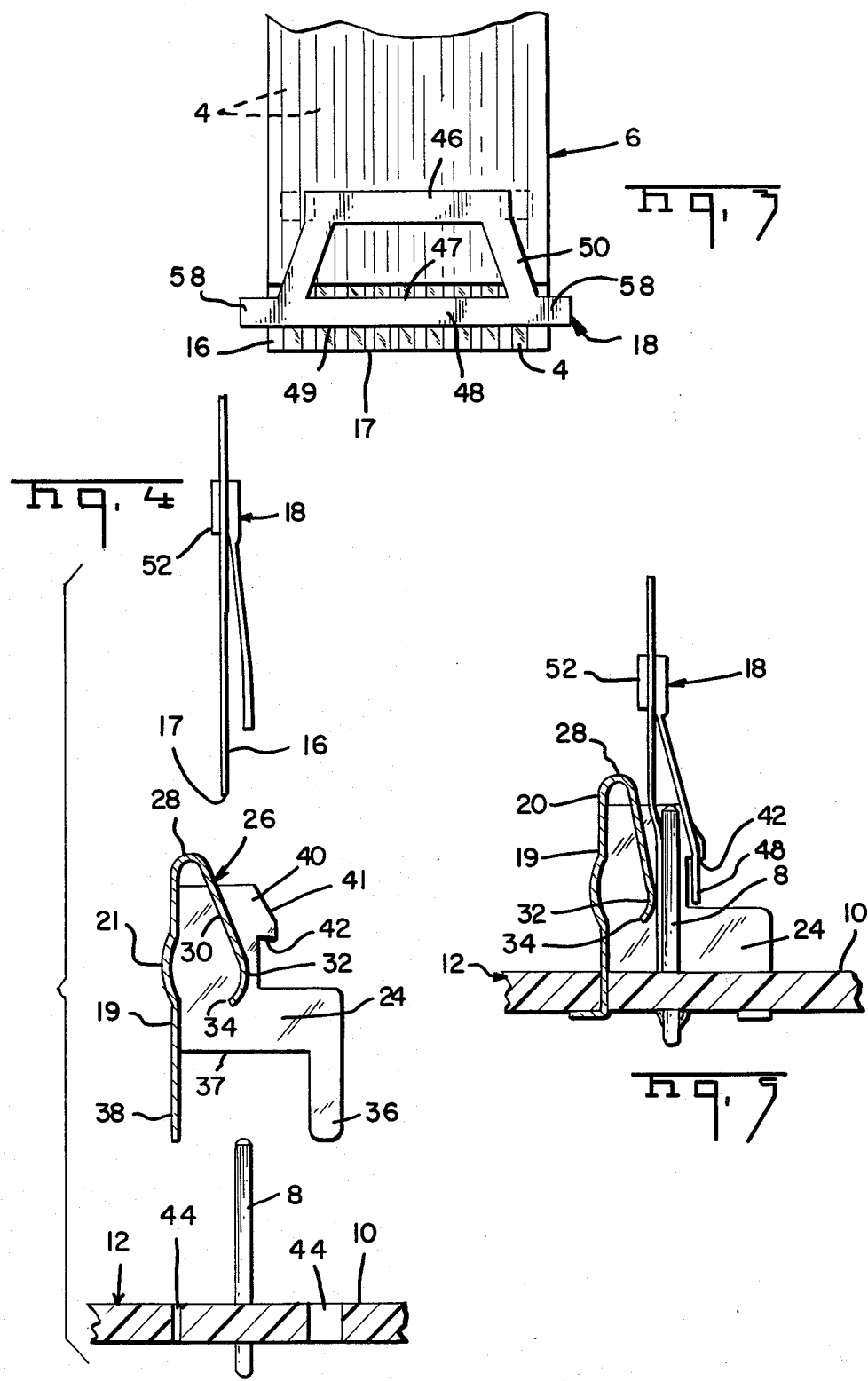

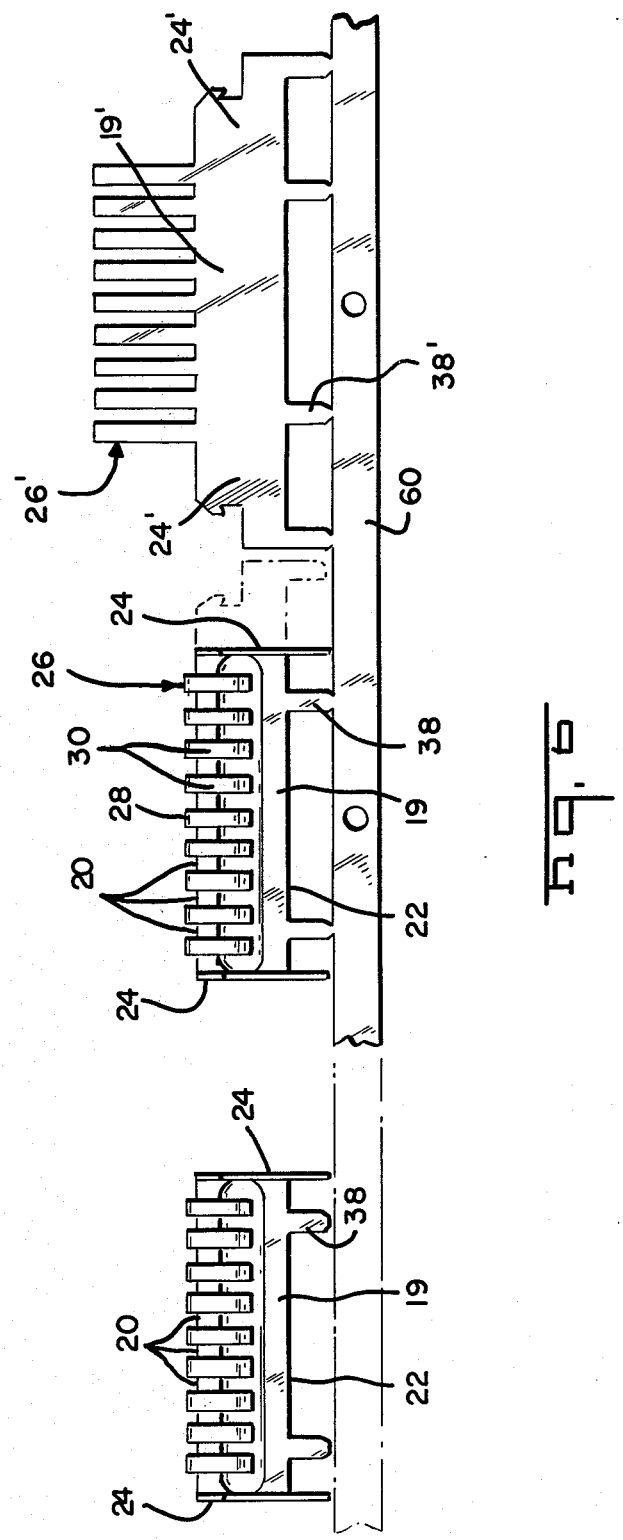

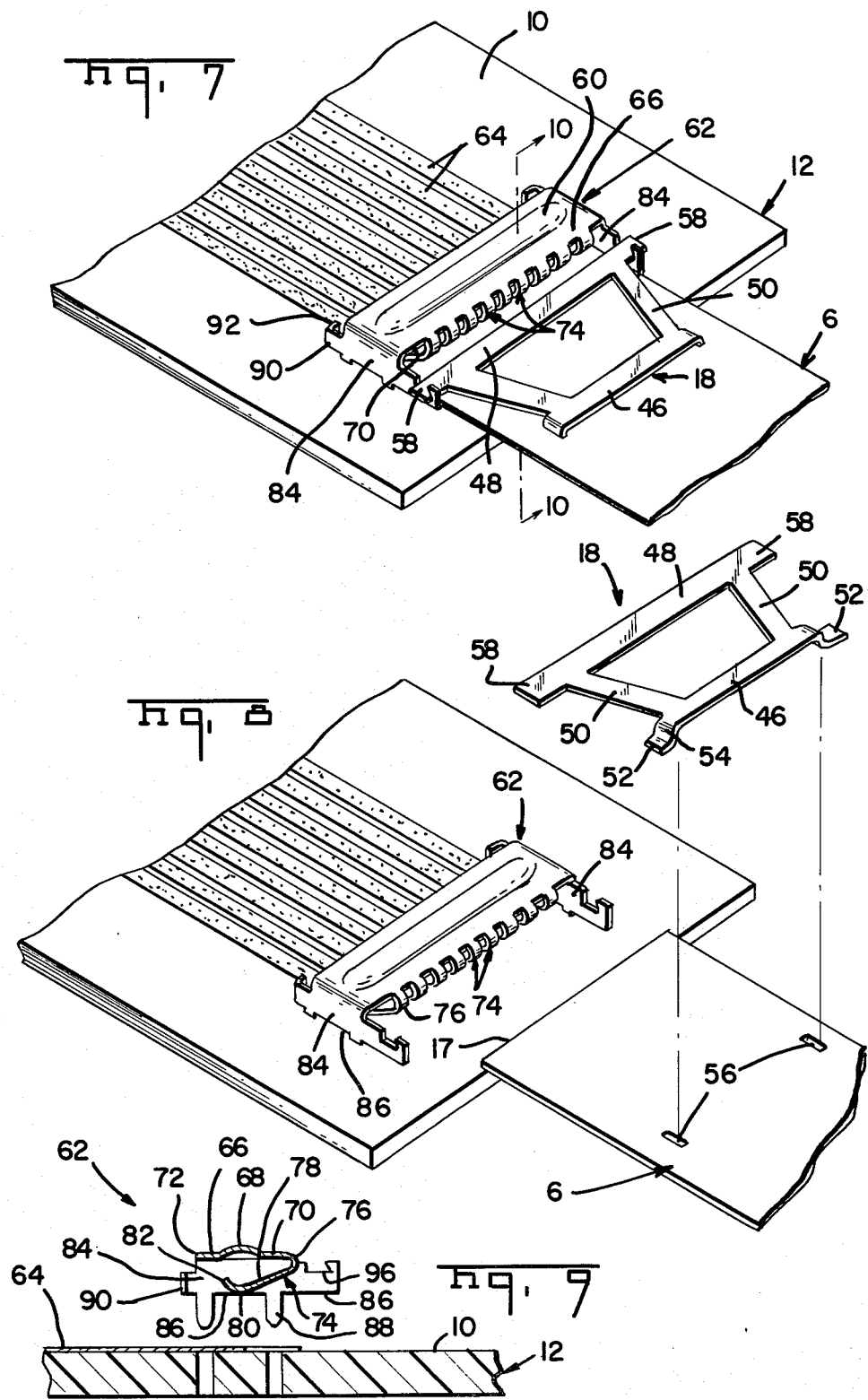

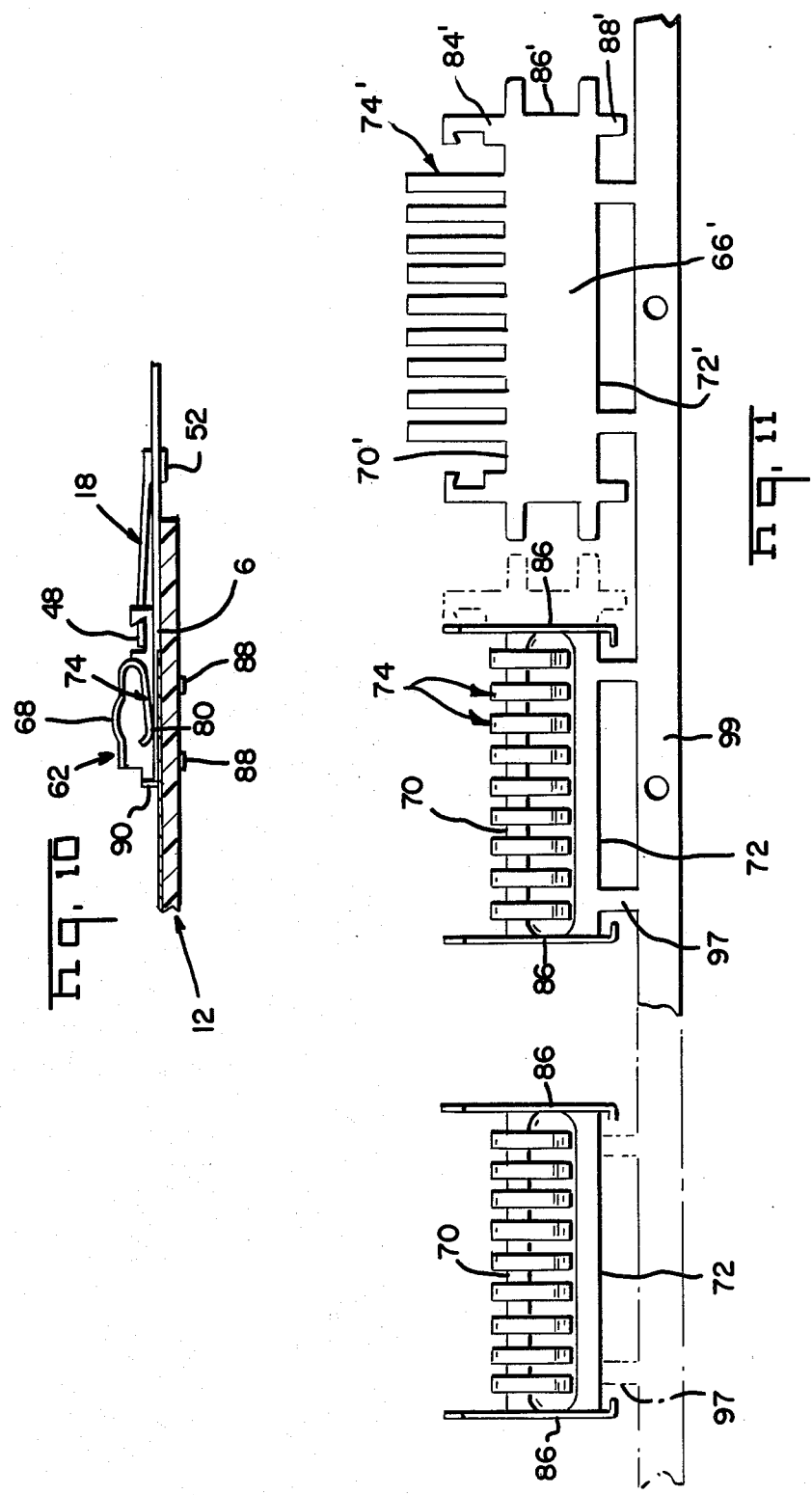

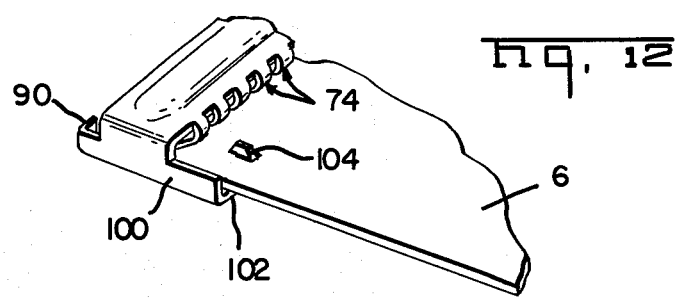
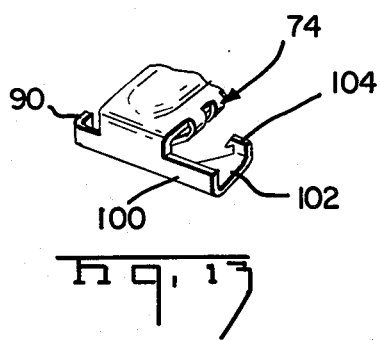

CONNECTOR CLIP FOR CONNECTING CABLE CONDUCTORS TO CIRCUIT BOARD CONDUCTORS

DESCRIPTION

BACKGROUND OF THE INVENTION

When the conductors in a flat conductor cable must be disengageably connected to conductors on a circuit board, it is common practice to use electrical connectors of a type comprising an insulating housing having contact terminals therein which are soldered to the conductors on the circuit board. The housing and the contact terminals are arranged such that the end of the flat conductor cable can be inserted into the housing and upon insertion, the conductors of the cable will be electrically contacted by the contact terminals. Other types of connectors for connecting flat conductor cable conductors to conductors on a circuit board are also known and most of them consist of an insulating housing containing contact terminals which conduct current from the cable conductors to the circuit board conductors.

The present invention is directed to the achievement of an improved and simplified connector for connecting the conductors of a flat conductor cable to conductors on a circuit board and which comprises a single one-piece stamped and formed device which holds the cable conductors directly against the circuit board conductors.

A connector clip in accordance with the present invention comprises a clip bar having a plurality of cantilever spring members extending from one of its longitudinal edges and flanges extending from its ends. The spring members are reversely formed and each has a spring arm which is between the flanges and a free end having pressure applying portion adjacent thereto. Mounting ears are provided on the clip and on the flanges so that the connector clip can be mounted on the board at a location such that the pressure applying portions of the spring members are against the conductors on the board. The cable conductors are connected to the circuit board conductors by stripping the insulating film from one surface of the cable and inserting the stripped portion into the connector clip with the plane of the film extending normally of the planes of the flanges. The cable is inserted until the exposed cable conductors are against the circuit board conductors and the pressure applying portions of the springs are pressing the cable conductors firmly against the circuit board conductors. Connector clips in accordance with the invention can be used to connect cable conductors to terminal posts extending from a board or to flat conductors on the surface of the circuit board. In accordance with a further aspect of the invention, there are provided interengageable shoulders on the cable and on the flanges of the connector clip so that the cable cannot be accidentally removed from the clip.

Preferred embodiments of the invention are described in detail below and are illustrated in the accompanying drawings in which:

FIG. 1 is a perspective view of a connector clip in accordance with one embodiment of the invention illustrating the manner in which the conductors of a flat cable are electrically connected to terminal posts extending from a circuit board.

FIG. 2 is a view similar to FIG. 1 but showing the flat cable exploded from the connector clip and the strain relief halter exploded from the cable.

FIG. 3 is a plan view of an end portion of the cable with the strain relief halter assembled thereto.

FIG. 4 is a sectional side view of the connector clip of FIG. 1 with the clip positioned in alignment with openings in a circuit board.

FIG. 5 is a sectional side view taken along the lines 5—5 of FIG. 1.

FIG. 6 is a plan view of a continuous strip of connector clips of the type shown in FIG. 1 and showing the flat blank from which the connector clips are formed.

FIG. 7 is a perspective view showing an alternative embodiment of a connector clip in accordance with the invention serving to connect the conductors in a flat cable to flat conductors on a circuit board.

FIG. 8 is a view similar to FIG. 7 but with the cable separated from the connector clip and with the strain relief halter exploded from the cable.

FIG. 9 is a transverse cross-sectional view of the connector clip of FIG. 7 showing the clip in alignment with holes in a circuit board.

FIG. 10 is a sectional view taken along the lines 10—10 of FIG. 7.

FIG. 11 is a plan view of a portion of a continuous strip of connector clips in accordance with the embodiment of FIG. 7 showing the flat blank from which the formed clips are produced.

FIG. 12 is a perspective view of a further embodiment having an alternative form of strain relief means for the flat cable.

FIG. 13 is a fragmentary perspective view of the connector clip shown in FIG. 12.

FIGS. 1–6 show a connector clip 2 which serves to connect the spaced apart conductors 4 in a flat cable 6 to spaced apart terminal posts 8 which extend from the upper surface 10 of a circuit board 12. The cable 6 contains a plurality of flat ribbon-like conductors 4 which are encased in a suitable insulating film such as a polyester commonly available under the trademark Mylar. As shown in FIG. 3, the insulating film is stripped at 16 from a portion of the cable adjacent to the end 17 so that the conductors 4 are exposed.

FIGS. 1 and 2 show a strain relief halter 18 which removably secures the cable to the connector clip as will be described subsequently. The connector clip 2 comprises a generally rectangular clip bar 19 which has a stiffening rib 21 embossed thereon to improve its resistance to flexure. The clip bar 19 has first and second side edges 20, 22 and flanges 24 extending in a common direction from its ends.

A plurality of spaced apart cantilever spring members 26 extend from the first edge 20 of the clip bar, the spacing between adjacent spring members being the same as the spacing between the conductors 4 and the terminal posts. These springs are reversely bent adjacent to the first edge 20 as shown at 28 so that the cantilever spring arms 30 are between the flanges 24. The lower or free ends 34 of the spring arms are reversely formed to provide a pressure applying portion 32 on each spring arm.

The connector clip 2 is mounted on the surface 10 of the circuit board in surrounding relationship to the row of posts 8 by means of mounting ears 36, 38 which extend from the lower edges 37 of the flanges 24 and from the second edge 22 of the clip bar 19. These ears are inserted through holes 44 in the circuit board and bent or formed laterally as shown in FIG. 5 so that the edges 37 and 22 of the connector clip will be against the surface of the circuit board.

Each flange 24 has a reduced width portion 40 at its upper end and the downwardly extending edge 41 of this reduced width portion slopes away from the clip bar to a downwardly facing shoulder 42 which cooperates with retaining ears on the strain relief halter 18.

As will be apparent from FIG. 4, when the connector clip is mounted on the circuit board, the pressure applying portions 32 of the spring arms will be resiliently biased against the surfaces of the post 8; in other words, spring arms are preloaded against the posts. When the conductors 4 of the cable are to be connected to the terminal posts 8, the lower portion of the cable is positioned above the connector clip with the plane of the cable extending normally of the planes of the flanges 24 and with the exposed conductors facing away from the clip bar 19. The cable is then moved downwardly until the lower end 17 is against the surface 10 of the circuit board at which time the individual conductors 4 will be firmly pressed against the surfaces of the terminal posts 8 by the spring arms 30 as shown in FIG. 5. The connector clip should be dimensioned such that the distance between the opposed internal surfaces of the flanges 24 is only slightly greater than the width of the cable. These surfaces can thus function as guide surfaces for the edges of the cable 6 and ensure that the conductors 4 will be in alignment with the terminal posts.

When a strain relief device is required for the cable, the halter 18 is assembled to the cable prior to insertion of the end 17 into the interior of the clip. This halter is preferably of a molded plastic insulating material which is relatively rigid but which is stiffly flexible to permit its assembly to the cable. The halter may be, for example, of a suitable nylon composition containing a filler material such as glass fibers to enhance its stiffness.

The halter comprises spaced-apart normally co-planar bands 46, 48 which are connected to each other by connecting strips 50. The halter is attached to the cable by means of attaching ears 52 which extend from the ends of the upper band 46 and which are inwardly offset from this band as shown at 54. The attaching ears 52 are inserted through openings 56 which are punched in the cable 6 between adjacent conductors 4 and the distance between the attaching ears 52 is slightly greater than the distance between the holes 56 so that the halter can be assembled to the cable by flexing the halter to insert the ears through the holes 56 and then allowing the halter to return to its normal flat condition.

Retaining ears 58 extend from the ends of the lower band 58 outwardly of the connecting strip members 50, these ears 58 extending beyond the side edges of the cable 6 as shown in FIG. 3. When the cable with the halter 18 attached thereto is moved downwardly to the position of FIG. 5, the lower edge 49 of the band 48 rides over the edges 41 upper portions 40 of the flanges and the lower band flexes outwardly until the upper edge 47 of the band 48 passes the shoulder 42 at which time the retaining ears 58 move relatively towards the cable and the upper edges of the ears lodge against the shoulders 42. The mounting ears should be dimensioned such that they can be pushed or snapped into the pockets beneath the shoulders 42 when the halter is engaged with the flanges. The halter can be flexed to disengage ears 58 from the shoulders 42 when it is desired to remove the cable from the clip.

Connector clips in accordance with the embodiment of FIG. 1 can be manufactured as a continuous strip as shown in FIG. 6 with the individual connector clips extending from a continuous carrier strip 60 and connected to the carrier strip at the ends of the mounting ears 38. FIG. 6 also shows the flat blank from which the clip is produced, the parts of the blank being identified by the same reference numbers, differentiated by prime marks, as are used in the description of the clip. Continuous strip as shown in FIG. 6 can be mounted on a reel and the individual clips can be removed from the strip and inserted into circuit boards by suitable automatic insertion machinery.

The connector clip described above and the clips described below can be manufactured of any suitable material having good spring characteristics such as a suitable steel. Electrical conductivity is not important since the clip does not carry electrical current. It is not necessary that an insulating coating be provided on the clip since it does not contact the conductors of the cable however, an insulating coating can be provided if required for reasons of safety. The coating may comprise a thin varnish-type coating such as a poly-vinyl formal resin coating of the type used for insulation on coil wires.

FIGS. 7-11 show an embodiment comprising a connector clip 62 which serves to connect the conductors 4 of the cable 6 to parallel spaced-apart conductors 64 on the surface 10 of the circuit board 12. The clip 62 comprises a clip bar 66 provided with a stiffening rib 68 and having first and second edges 70, 72. The cantilever spring members 74 extend from the first edge 70, are reversely bent adjacent to the edge at 76, and have spring arms 78 which are between the flanges 84. The spring arms are reversely formed at their free ends 82 to define a pressure applying portion 80 as previously described.

The flanges 84 are relatively more narrow than the flanges of the previously described embodiment and have edges 86 which extend parallel to the clip bar and which are against the surface 10 of the circuit board when the connector clip is mounted on the circuit board by means of the mounting ears 88. Stop ears 90 extend leftwardly as viewed in FIG. 7 from the flanges and have inwardly directed ends 92 against which the end 17 of the cable is pushed when the cable is inserted.

The flanges extend beyond the reverse bends 76 and notches 96 are provided in the upper edges of these extensions of the flanges. These notches 96 are dimensioned to receive the ears 58 of the strain relief halter as shown in FIG. 7.

The clip 62 is assembled to the circuit board by inserting the ears 88 through the holes in the board and forming them laterally as shown in FIG. 10. As with the previously described embodiment, the pressure applying 80 portions of the spring arms bear against the conductors 64 and are pre-loaded against these conductors. To connect the conductors of the cable 6 to the conductors 64, it is merely necessary to orient the cable with the exposed conductors opposed to the surface of the circuit board and insert the cable under the spring members until the end 17 is against the stop ears 90. The cable is removably latched to the clip by means of the halter as shown in FIG. 7. It will be noted that in FIG. 7 the halter is applied to the surface of the cable which is unstripped while it is applied to the stripped side of the cable in FIG. 1.

The connector clip of FIG. 7 can be manufactured in strip form as shown in FIG. 11 with the individual clips connected to carrier strip 99 by connecting sections 97. The connecting sections 97 are removed upon mounting the individual clips on circuit boards since these connecting sections do not serve as mounting ears. FIG. 11 also shows the flat blank from which the clip is formed, the same reference numerals, differentiated by prime marks, being used to denote the parts of the blank as are used in the description of the formed connector clip.

FIGS. 12 and 13 show an embodiment which is similar in most respects to the embodiment of FIG. 7, but which does not require the strain relief halter 18. In this embodiment, each of the flanges has a portion 100 which extends beyond the reverse bends of the spring members. Arms 102 extend inwardly from the flange extensions 100 and hooks 104 are provided on the ends of these arms. In this embodiment, the hooks or ears are received directly in the holes 56 in the cable to provide a strain relief for the cable.

I claim:

1. An electrical connector clip for connecting the spaced apart parallel cable conductors of a flat conductor cable to circuit board conductors on a circuit board, said connector clip comprising:
    a generally rectangular clip bar having first and second parallel side edges and having a flange extending from each end thereof, said flanges extending in the same direction,
    a plurality of cantilever springs extending from said first side edge, said springs being spaced apart by distances equal to the spacing between said cable conductors and said circuit board conductors, each of said springs having a reverse bend adjacent to said first side edge and having a spring arm which extends from said bend past said first side edge, said spring arms being between said flanges and having pressure applying portions adjacent to the free ends thereof, and
    mounting ear means for mounting said connector clip on a circuit board in partially surrounding relationship to said circuit board conductors with said circuit board conductors between said flanges and with said pressure applying portions of said spring arms against said circuit board conductors and,
    a retaining shoulder on each of said flanges, said retaining shoulders being cooperable with retaining means on said cable to retain said cable in engagement with said connector clip whereby,
upon mounting said connector clip on said circuit board, said cable conductors can be electrically connected to said circuit board conductors by removing insulation from a portion of one surface of said cable to expose said cable conductors, thereafter orienting said cable with the exposed conductors adjacent to, and in alignment with, said circuit board conductors and inserting said cable past said one side edge of said clip bar so that said exposed cable conductors move between said circuit board conductors and said pressure applying portions of said spring
    arms and upon engaging said retaining means on said cable with said retaining shoulders on each of said flanges, said cable will be removably secured to said clip.

2. A connector clip as set forth in claim 1, said clip being intended for use on a circuit board on which said conductors extend over the surface of said circuit board, said mounting ear means comprising mounting ears extending from edges of said flanges, said edges being spaced from, and extending parallel to, said clip bar whereby said clip can be mounted on said circuit board in straddling relationship to said conductors with said clip bar extending parallel to the surface of said circuit board and with said pressure applying portions of said springs against said conductors.

3. A connector clip as set forth in claim 2, each of said flanges having an extension which extends beyond said reverse bends of said springs, said retaining shoulders being on said extensions.

4. A connector clip as set forth in claim 3, each of said extensions having a hook means thereon, said shoulders being on said hook means.

5. An electrical connector clip as set forth in claim 1, said retaining means on said cable comprising a retaining halter removably secured to said cable and engagable with said shoulders on each of said flanges.

6. A connector clip and a retaining halter as set forth in claim 5, said halter having attaching ears which are insertable through openings in said cable to secure said halter to said cable.

7. Electrical connecting means for connecting the spaced-apart cable conductors at one end of a flat conductor cable to circuit board conductors on a circuit board, said connecting means comprising:
    a one-piece stamped and formed connector clip comprising a generally rectangular clip bar having first and second parallel side edges and having a flange extending from each end thereof, said flanges extending in the same direction, said clip being mounted on said circuit board with said clip bar extending transversely of, and being spaced from said conductors, and with edge portions of said flanges against said circuit board,
    a plurality of cantilever springs extending from said first side edge, said springs being spaced apart by distances equal to the spacing between said cable conductors and said circuit board conductors, each of said springs having a reverse bend adjacent to said first side edge and having a spring arm extending from said bend, said spring arms being between said flanges and having pressure applying portions adjacent to the free ends thereof, said pressure applying portions being against said conductors, and
    interengageable means on said flanges and on said cable adjacent to said one end, said interengageable means comprising openings in said cable adjacent to said one end of said cable and inwardly directed arms on said flanges, said arms being spaced from said one side edge of said clip bar, said inwardly directed arms having laterally extending hook-like ears which are dimensioned to enter said openings in said cable whereby,
upon inserting said one end of said cable between said circuit board conductors and said pressure applying portions of said springs, said cable conductors will be against said circuit board conductors and will be pressed against said circuit board conductors by said springs, and said hook-like ears will be received in said openings in said cable thereby providing a strain relief for said cable.

8. Electrical connecting means as set forth in claim 7, said connector clip being mounted on said circuit board with said clip bar extending parallel to, and being spaced from said circuit board, said conductors comprising flat conductors on said circuit board.

9. Electrical connecting means for connecting the spaced-apart cable conductors at one end of a flat conductor cable to circuit board conductors on a circuit board, said connecting means comprising:
- a one-piece stamped and formed connector clip comprising a generally rectangular clip bar having first and second parallel side edges and having a flange extending from each end thereof, said flanges extending in the same direction, said clip being mounted on said circuit board with said clip bar extending transversely of, and being spaced from said conductors, with said flanges extending towards said conductors, and with edge portions of said flanges against said circuit board,
- cantilever spring means extending from said first side edge, said spring means having a reverse bend adjacent to said first side edge and having spring arm means extending from said bend, said spring arm means being between said flanges and having pressure applying portions adjacent to the free end thereof, said pressure applying portions being against said conductors, and
- interengageable shoulder means on said flanges and on said cable adjacent to said one side edge whereby, upon inserting said one end of said cable between said circuit board conductors and said pressure applying portions of said spring means, said cable conductors will be against said circuit board conductors and will be pressed against said circuit board conductors by said spring means, and said shoulder means will be interengaged and serve as a strain relief for said cable.

10. A connector clip as set forth in claim 9, said clip being intended for use on a circuit board on which said circuit board conductors comprise terminal posts, said mounting ear means comprising mounting ears extending from said second side edge of said clip bar for mounting said clip on said circuit board with said clip bar extending normally of said circuit board so that said pressure applying portions of said springs are against said posts.

* * * * *